United States Patent
Chiu et al.

(10) Patent No.: US 9,812,379 B1
(45) Date of Patent: Nov. 7, 2017

(54) SEMICONDUCTOR PACKAGE AND MANUFACTURING METHOD

(71) Applicant: WIN Semiconductors Corp., Tao Yuan (TW)

(72) Inventors: Jui-Chieh Chiu, Taoyuan (TW); Chih-Wen Huang, Taoyuan (TW); You-Cheng Lai, Taoyuan (TW)

(73) Assignee: WIN Semiconductors Corp., Tao Yuan (TW)

( * ) Notice: Subject to any disclaimer, the term of this patent is extended or adjusted under 35 U.S.C. 154(b) by 0 days.

(21) Appl. No.: 15/298,221

(22) Filed: Oct. 19, 2016

(51) Int. Cl.
| | | |
|---|---|---|
| H01L 21/00 | (2006.01) | |
| H01L 23/02 | (2006.01) | |
| H01L 23/495 | (2006.01) | |
| H01L 23/498 | (2006.01) | |
| H01L 21/48 | (2006.01) | |

(52) U.S. Cl.
CPC ...... *H01L 23/4951* (2013.01); *H01L 21/4853* (2013.01); *H01L 23/49811* (2013.01)

(58) Field of Classification Search
CPC ................. H01L 23/4951; H01L 23/49811
USPC .................... 438/108, 460; 257/686
See application file for complete search history.

(56) References Cited

U.S. PATENT DOCUMENTS

| | | | | |
|---|---|---|---|---|
| 9,425,121 B2* | 8/2016 | Tsai | ...... | H01L 21/563 |
| 2015/0228591 A1* | 8/2015 | Kim | ...... | H01L 24/17 |
| | | | | 257/692 |
| 2016/0013076 A1* | 1/2016 | Vincent | ...... | H01L 24/19 |
| | | | | 257/777 |

* cited by examiner

*Primary Examiner* — Calvin Lee
(74) *Attorney, Agent, or Firm* — Winston Hsu

(57) ABSTRACT

A semiconductor package includes a die comprising at least a via and a least a hot via; a ground lead, formed directly under a back side of the die, contacting with the back side of the die, and directly connected to the a least a hot via and the at least a via of the die; a buffer layer, formed on the die, configured to absorb a stress applied to the die and prevent the die from damage; and a molding portion, formed on the die buffer layer.

16 Claims, 11 Drawing Sheets

SEMICONDUCTOR PACKAGE AND MANUFACTURING METHOD

BACKGROUND OF THE INVENTION

1. Field of the Invention

The present invention relates to a semiconductor package and a manufacturing method, and more particularly, to a semiconductor package and a manufacturing method with small size, low cost and capable of preventing a die from being damaged.

2. Description of the Prior Art

As technology evolves, wireless communication is an important part of human life. Various electronic communication devices, such as smart phones, smart wearable devices, tablets, etc., utilize a wireless radio frequency (RF) front end module (FEM) to transmit and receive wireless RF signals.

Since the electronic communication devices are required to have small sizes, the RF FEM is also required to have a small size. Recently, a wafer level packaging (WLP) technology is popular for producing small area devices. Please refer to FIG. 9, which is a schematic diagram of a WLP process manufacturing a RF FEM in the prior art. According to the WLP process, once a monolithic microwave integrated circuit (MMIC) wafer MWF is formed, a cap wafer CWF is bounded on the wafer MWF, where the wafer MWF comprises a plurality of dies DE therein. An air cavity AC is formed between the cap wafer CWF and the wafer MWF to protect the dies from being damaged. After the cap wafer CWF is bonded on the wafer MWF, a singulation process is perform, so as to divide a bounded wafer (i.e., the wafer MWF bounded with the cap wafer CWF) into a plurality of MMIC packages PK. Hence, the MMIC packages PK would have small areas.

However, bonding the cap wafer on the MMIC wafer is expensive, and a thickness of the MMIC packages PK is relative large. Therefore, how to prevent the die from being damaged and lower a production cost thereof is a significant objective in the field.

SUMMARY OF THE INVENTION

It is therefore a primary objective of the present invention to provide a semiconductor package and a manufacturing method with small size and low cost, to improve over disadvantages of the prior art.

An embodiment of the present invention discloses a semiconductor package, comprising a die, comprising at least a via and a least a hot via; a ground lead, formed directly under a back side of the die, contacting with the back side of the die, and directly connected to the at least a via of the die; a signal lead, formed directly under the back side of the die, contacting with the back side of the die, and directly connected to the a least a hot via of the die; a buffer layer, formed on the die, configured to absorb a stress applied to the die and prevent the die from damage and prevent to contact to molding to generate unwanted parasitic effect and loss; and a molding portion, formed on the die buffer layer.

An embodiment of the present invention further discloses a manufacturing method of a plurality of semiconductor packages, the method comprising steps of forming signal leads and ground leads directly under a back side of a wafer, wherein the wafer comprises a plurality of dies, and each die comprises at least a via and a least a hot via; forming a buffer layer on the wafer; forming a molding portion on the buffer layer; and performing a singulation process to divide the wafer, the buffer layer and the molding portion into the plurality of semiconductor packages.

An embodiment of the present invention further discloses a manufacturing method of a plurality of semiconductor packages, the method comprising steps of forming signal leads and ground leads directly under a back side of a die, wherein the die comprises at least a via and a least a hot via; forming a buffer layer on the die; forming a molding portion on the buffer layer; and performing a singulation process to form a plurality of semiconductor packages.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
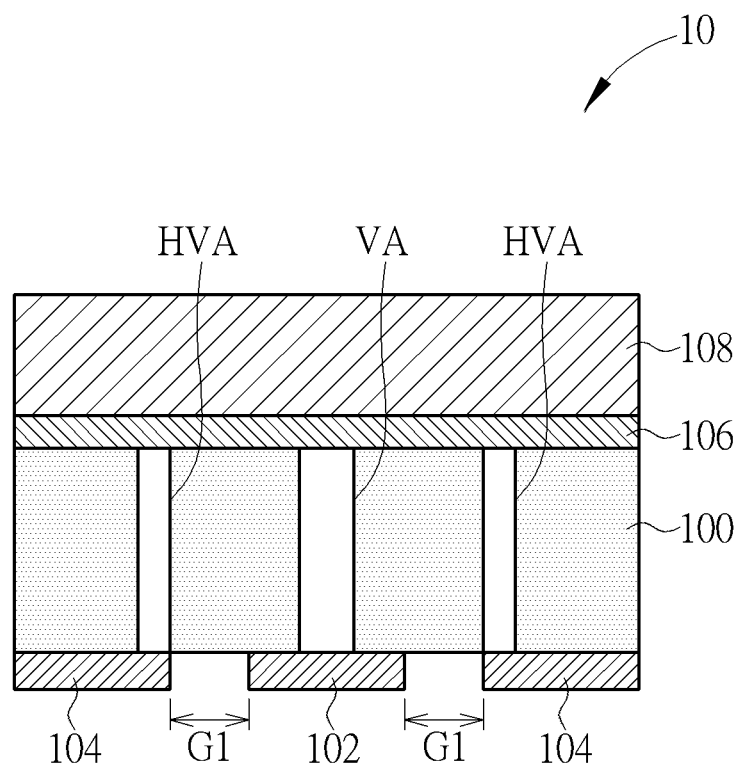
FIG. 1 is a schematic diagram of a sectional side view of a semiconductor package according to an embodiment of the present invention.

Please refer to FIG. 1, which is a schematic diagram of a sectional side view of a semiconductor package 10 according to an embodiment of the present invention. The semiconductor package 10 may be a radio frequency (RF) front end module (FEM) of a wireless communication device, and manufactured by a wafer level packaging (WLP) technology. The semiconductor package 10 comprises a die 100, a ground lead 102, signal leads 104, a buffer layer 106 and a molding portion 108. The die 100 may be a monolithic microwave integrated circuit (MMIC), manufacture by a Gallium Arsenide (GaAs) process, and applied in a high frequency or radio frequency (RF) application. The die 100 comprises hot vias HAV and vias VA for signal and ground connection. The hot vias HAV are configured to deliver an RF signal (or a DC signal) and the vias VA are used to provide grounding. The ground lead 102 and the signal leads 104 are formed directly under a back side of the die 100, which means that the ground lead 102 and the signal leads 104 have contact with the back side of the die 100 directly. In addition, the ground lead 102 is directly connected to the vias VA, and the signal leads 104 are directly connected to the hot vias HAV.

The molding portion 108 is made of a molding compound (e.g., epoxy resin) and formed above the die 100 according to a molding process. Notably, during the molding process, a pressure or a stress is applied to the die 100. To prevent the pressure or the stress from damaging the die 100, the buffer layer 106 is formed between the die 100 and the molding portion 108. That is, the buffer layer 106 is formed on a top side of the die 100, and the molding portion 108 is formed on the buffer layer 106. The buffer layer 106 may be made of an elastic material, which is selected from a group consisting of polyimide (PI), polybenzoxazole (PBO), and benzocyclobuten (BCB) and silicon nitride ($SiN_2$), so as to absorb/disperse the stress applied to the die 100 during the molding process.

In addition, a gap G1 is formed between the ground lead 102 and the signal lead 104. To facilitate assembly, the gap G1 should be sufficiently large/wide, e.g., larger/wider than 150 micrometer (μm), to prevent short circuit problem thereof. In an embodiment, the gap G1 may be 300 μm.

Furthermore, to achieve a better grounding and thermal performance of the semiconductor package 10, an area of the ground lead 102 should be sufficiently large. In an embodiment, the area of the ground lead 102 is larger than 150*150*square micrometers ($μm^2$). In another embodiment, the area of the ground lead 102 is larger than 50% of an area of the back side of the die 100.

Figure 2:
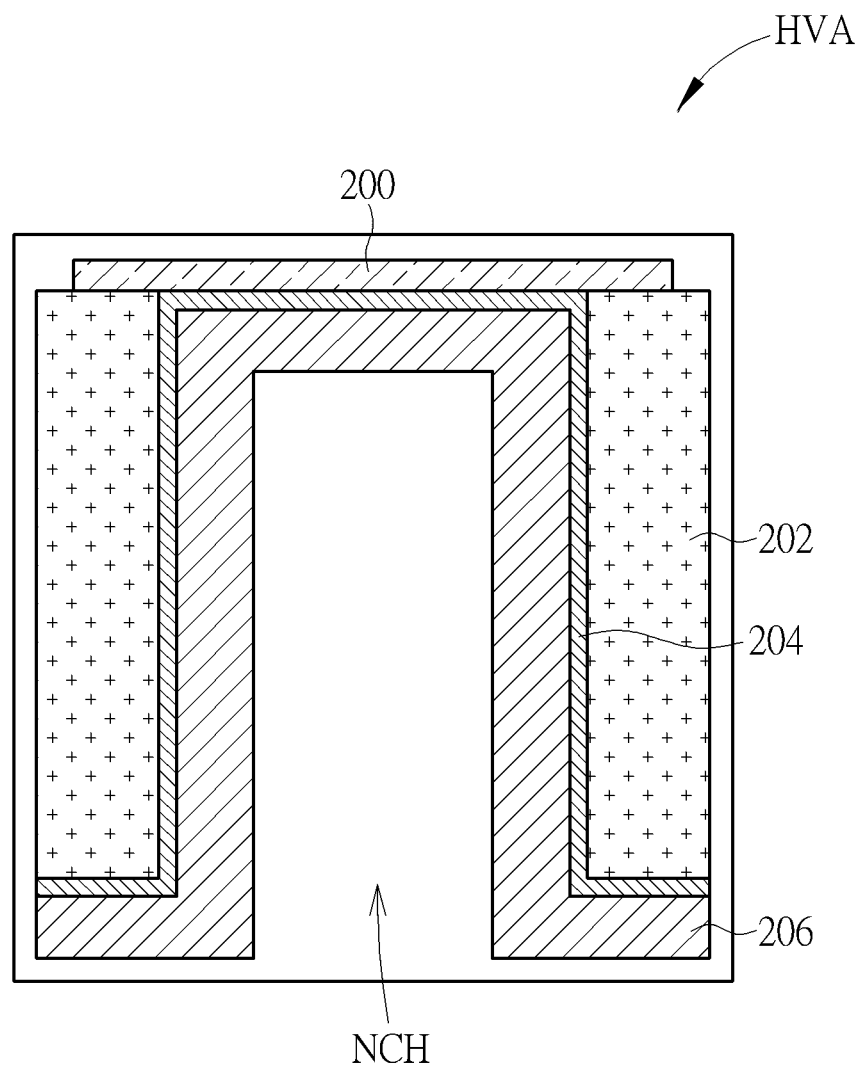
FIG. 2 is a schematic diagram of a hot via according to an embodiment of the present invention.

In another perspective, the hot via HAV comprises a hollow structure. Please refer to FIG. 2, which is a schematic diagram of a sectional view of the hot via HAV according to an embodiment of the present invention. The hot via HAV comprises a top metal 200, a GaAs substrate 202, a first backside metal 204 and a second backside metal 206. As FIG. 2 shows, a notch NCH is formed in a center of the hot via HAV, which means that the hot via HAV is hollow in the center. The hollow hot via HAV may sustain a pressure or a stress caused by a back side assembly process of the die 100. In addition, the top metal 200 covers a topside of the hollow to sustain the stress coming from the molding process, and therefore protect the die 100.

Figure 3:
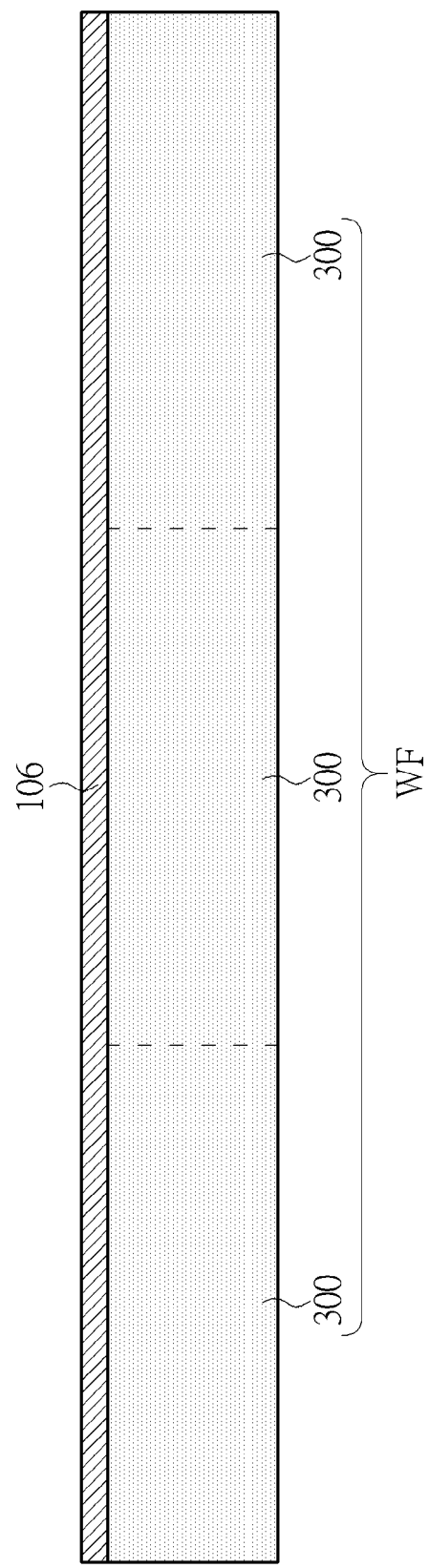
FIGS. 3-7 illustrate a process of manufacturing the semiconductor package of FIG. 1.
Figure 4:
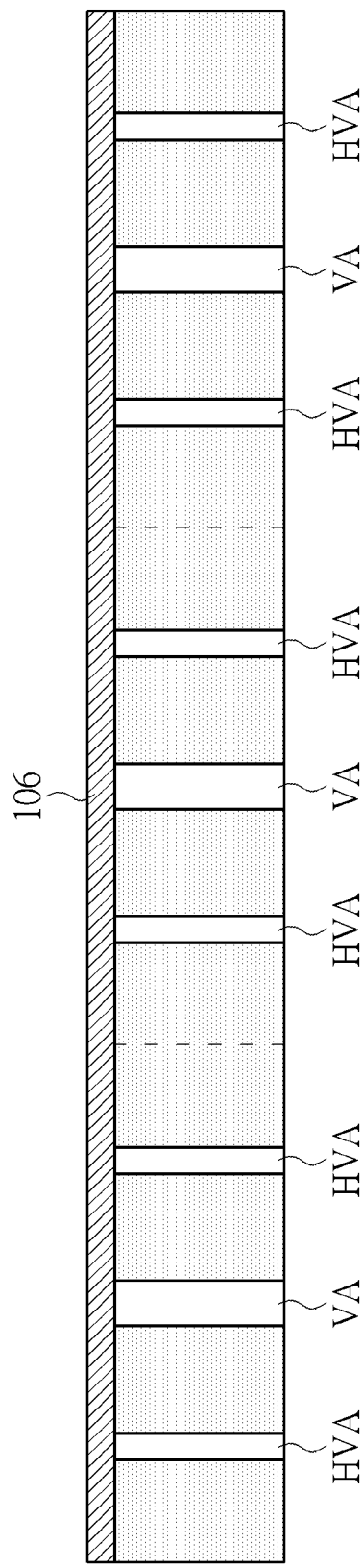
Figure 5:
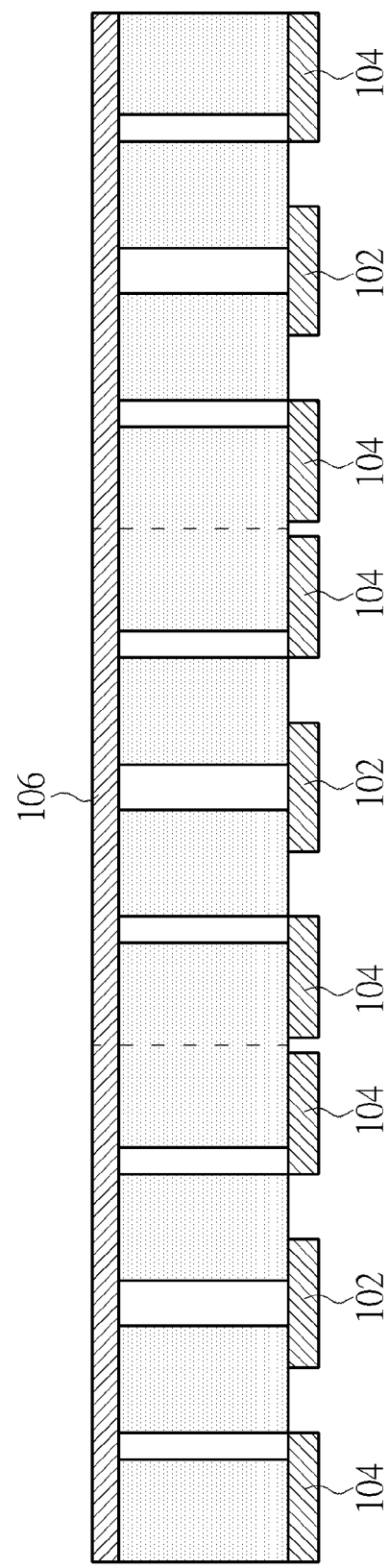

Steps of manufacturing the semiconductor package 10 are referred to FIGS. 3-7, which illustrate a process of manufacturing the semiconductor package 10. As FIG. 3 shows, the buffer layer 106 is formed on a wafer WF including dies 300, where there is no vias and hot vias within the dies 300. As FIG. 4 shows, the vias VA and the hot vias HAV is formed. The wafer WF includes the dies 100 in which the vias VA and the hot vias HAV is formed. As FIG. 5 shows, the signal leads 104 and the ground leads 102 are formed directly under a back side of the wafer WF, i.e., the signal leads 104 and the ground leads 102 are formed directly under the back side of the dies 100. The signal leads 104 and the ground leads 102 may be formed via deposition, e.g., by electroless plating using gold (Au) or gold-tin alloy (AuSn). Note that, a dashed line in FIG. 5 represents a singulating/sawing edge for a singulation process, and a part of the signal leads 104 which is below the singulating edge is removed, so as to prevent the signal leads 104 from being torn out during the singulation process.

Figure 6:
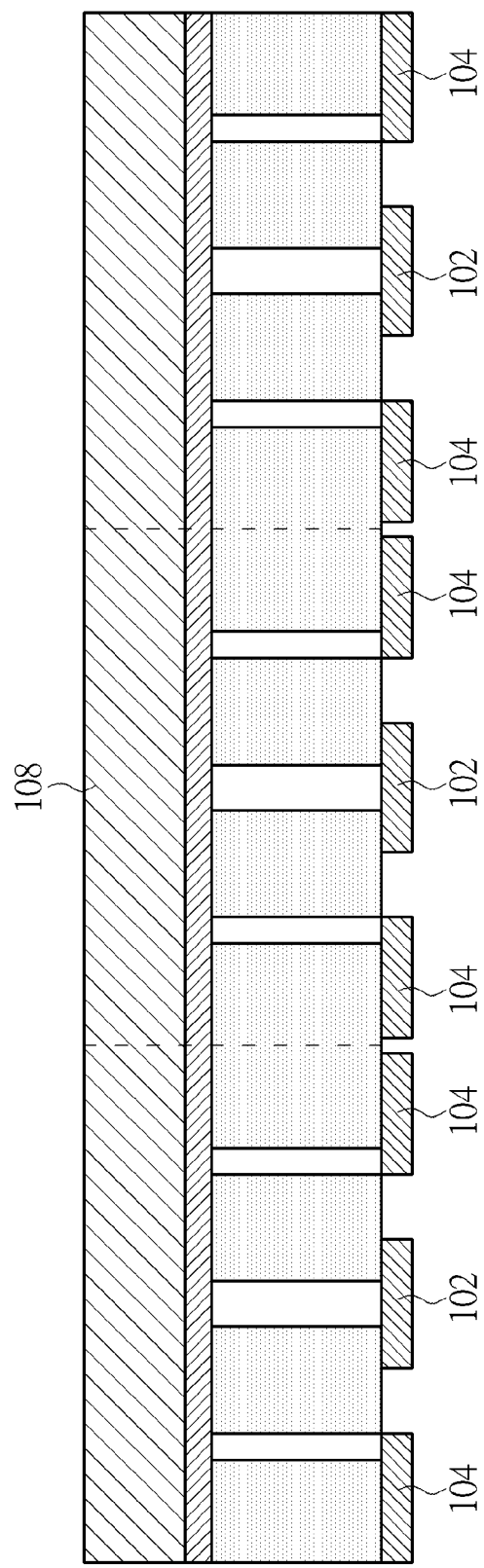

Referring to FIG. 6, in which a molding process is performed. During the molding process, a significant pressure/stress is applied on the wafer WF. Since the buffer layer 106 is made of the elastic material, the buffer layer 106 is able to absorb/disperse the pressure/stress applied to the wafer WF, and prevent the wafer WF from being damaged. Notably, since the wafer WF is protected by the buffer layer 106, there is no need to employ a cap wafer to form an air cavity. In addition, forming the molding portion 108 is cheaper than applying the cap wafer on the wafer WF to form the air cavity, and an overall thickness is reduced.

Figure 7:
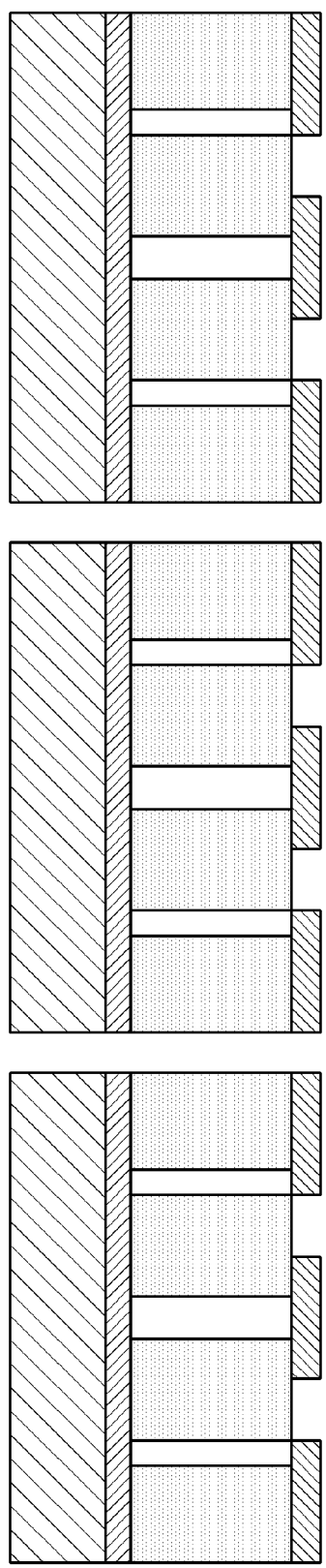

Referring to FIG. 7, in which the singulation process or a wafer dicing process is performed. The wafer WF, the buffer layer 106 and the molding portion 108 are divided into a plurality of semiconductor packages 10. Preferably, an area of a side of the die 100 is the same as an area of a side of the semiconductor package 10, which reduces the area of the semiconductor package 10 to be as small as possible. In such a condition, side edges of the molding portion 108 are aligned with side edges of the die 100. In addition, the wafer WF may be performed by a checkerboard cut during the singulation process, such that the semiconductor package 10 is formed as rectangle. After the semiconductor packages 10 are formed, the semiconductor packages 10 may be performed an assembly process, which is, for example, to dispose/install the semiconductor packages 10 on circuit boards (e.g., a printed circuit board (PCB)) for certain electronic devices.

Note that, in the semiconductor package 10, the molding portion 108 does not directly contact the leads (i.e. the signal leads 104 or the ground leads 102), which is to prevent undesired parasitic inductive effect or parasitic capacitive effect. Therefore, the semiconductor package 10 would have better RF performance.

As can be seen, the present invention utilizes the molding portion 108 to reduce the thickness and the production cost of the semiconductor package 10, and utilizes the buffer layer 106 to absorb/disperse the pressure/stress applied to the die 100 and prevent the die 100 from being damaged. The buffer layer 106 also isolate the RF signal from being contacted with the molding portion directly. In this way, the undesired RF parasitic effect and loss can be prevented. The ground lead 102 and the signal leads 104 are directly formed under the back side of the die 100, and there is no need for an additional laminate printed circuit board (PCB). Compared to the prior art, since there is no need to use cap to form the air cavity, the size and the production cost of the semiconductor package 10 are reduced.

Figure 8:
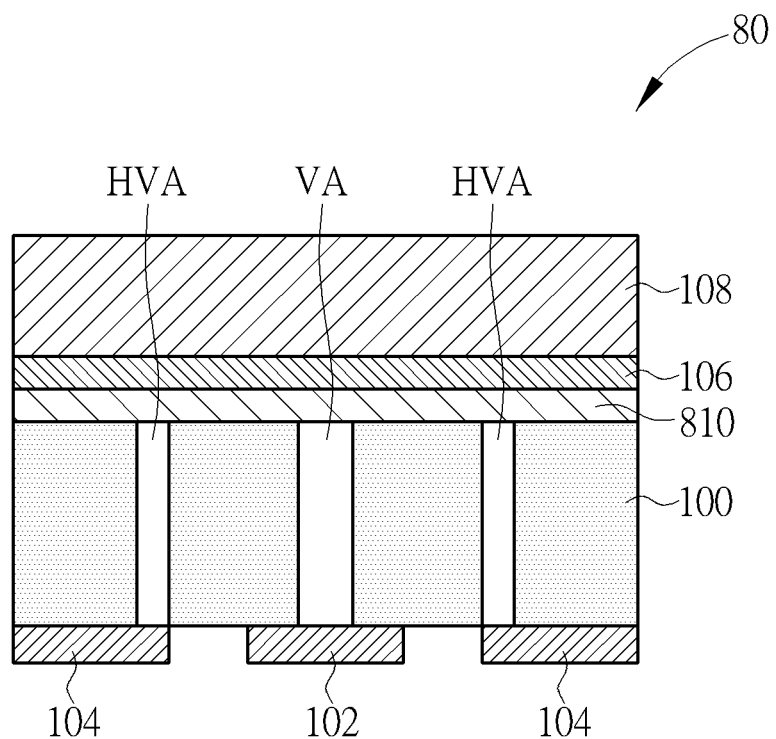
FIG. 8 is a schematic diagram of a sectional side view of a semiconductor package according to an embodiment of the present invention.
Figure 9:
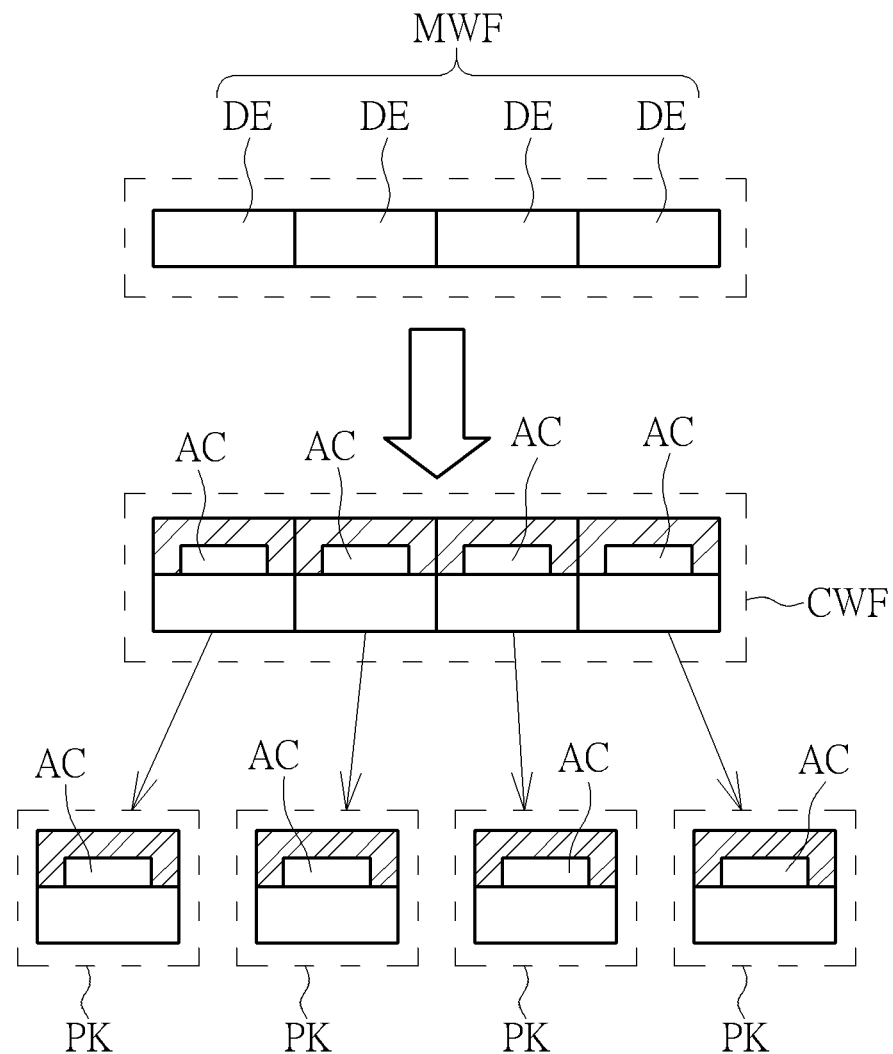
FIG. 9 is a schematic diagram of a wafer level packaging (WLP) process in the prior art.

Notably, the embodiments stated in the above are utilized for illustrating the concept of the present invention. Those skilled in the art may make modifications and alterations accordingly, and not limited herein. For example, at least a metal sheet may be included in the semiconductor package. Please refer to FIG. 8, which is a schematic diagram of a sectional side view of a semiconductor package 80 according to an embodiment of the present invention. The semiconductor package 80 is similar to the semiconductor package 10, and thus, the same components are denoted by the same symbols. Different from the semiconductor package 10, the semiconductor package 80 further comprises a metal sheet 810 disposed on the top side of the die 100, and the buffer layer 106 is formed between the metal sheet 810 and the molding portion 108. The metal sheet 810 may sustain the pressure/stress applied to the die 100 during the molding process, and thus protect the die from being damaged.

Figure 10:
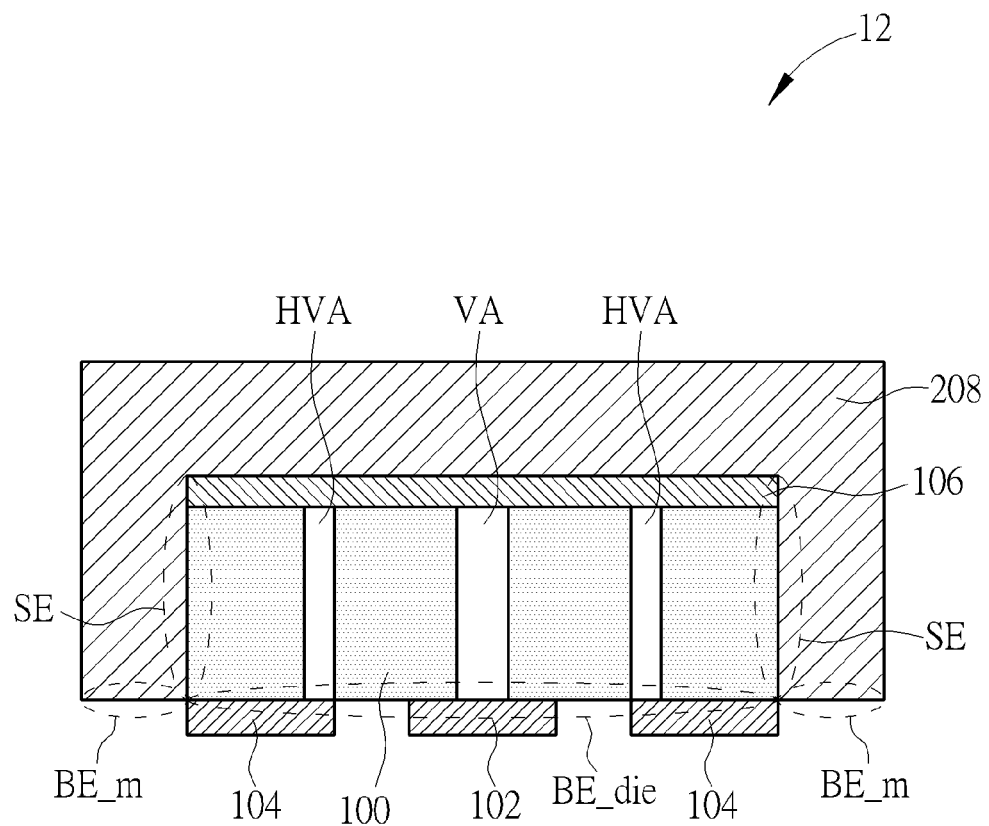
FIG. 10 is a schematic diagram of a sectional side view of a semiconductor package according to an embodiment of the present invention.

In addition, the side edges of the molding portion/compound are not limited to be aligned with the side edges of the die 100. The molding portion may cover the side edges of the die 100. For example, please refer to FIG. 10, which is a schematic diagram of a sectional side view of a semiconductor package 12 according to an embodiment of the present invention. The semiconductor package 12 is similar to the semiconductor package 10, and thus, the same components are denoted by the same symbols. Different from the semiconductor package 10, a molding portion 208 comprised in the semiconductor package 80 further covers the side edges SE of the die 100. In addition, as can be seen from FIG. 10, bottom edges BE_m of the molding portion 208 are aligned with a bottom edge of the die 100.

Figure 11:
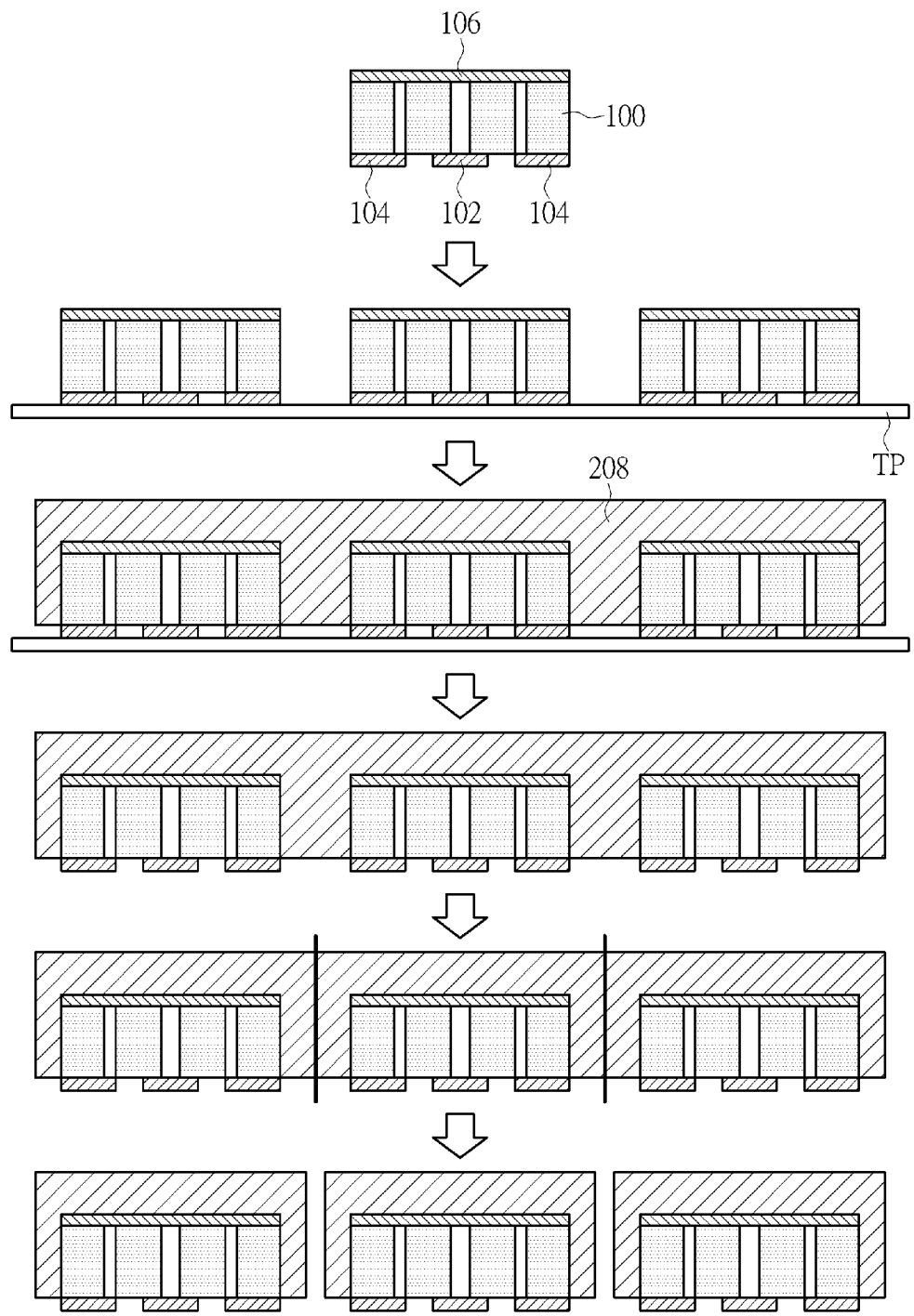
FIG. 11 illustrates a process of manufacturing the semiconductor package of FIG. 10.

Specifically, steps of manufacturing the semiconductor package 1b are referred to FIG. 11, which illustrate a process of manufacturing the semiconductor package 12. AS shown in FIG. 11, first of all, the vias VA and the hot vias HAV are formed within the die 100, and the buffer layer 106 is formed on a top side of the die 100. In addition, the signal leads 104 and ground leads 102 are formed directly under a back side of the die 100. Secondly, the dies 100 are attached by a tape TP. The tape TP would prevent the molding compound from leaking and having contact with the signal leads 104 and the ground leads 102. In addition, during a molding process, the molding compound is added on the top side of the tape TP and dies 100, to form the molding portion 208. Since the buffer layer 106 is formed on the dies, the buffer layer 106 would protect the die 100 from being damaged by the molding pressure and stress during the molding process. After molding compound is formed, the back side tape could be removed. Finally, the molding portion 208 is singulated/sawed and a plurality of rectangle semiconductor packages 12 is formed. After the plurality of rectangle semiconductor packages 12 is formed, the plurality of rectangle semiconductor packages 12 may be performed the assembly process to dispose/install the semiconductor packages 12 on the circuit boards for certain electronic devices. Different from a molding fluid dispensing method in the art, the molding portion 208 of the semiconductor package 12 may hardly have contact with the leads under the back side of the semiconductor package 12. In addition, the molding compound would not leak to the gap between the signal leads 104 and the ground leads 102. Hence, undesired parasitic inductive effect or parasitic capacitance effect are avoided, such that the RF performance of the semiconductor package 12 is enhanced.

As can be seen, the RF signal on the top side of the die will be delivered to the back side of the die by using hot via directly. Since the die and molding compound is separate by buffer layer, the RF signal would not have contact with the molding portion. The molding cover from the top side of the die and will be stop before back side metal of the die. By this way, the molding portion would not have contact with the back side lead/metal. Hence, the unwanted parasitic effect and loss will be avoided.

Compared to the prior art, the leads (and bonding wires) carrying the RF signal would have contact with the molding compound, such that the undesired parasitic inductive effect or parasitic capacitance effect is formed and the RF performance is degraded.

In addition, the hot via structure of the art is hard to be applied in a standard reflow process. Since the gap between the hot via and ground is as close as possible in the art, due to a performance consideration. To overcome the reflow process issues, the gap of the hot via is increased to be larger than 150 um, and the pad size of the hot via is increase to larger than 150×150 um$^2$. It would have better quality factor while the back side metal of the inductance is removed. Therefore, the effect could be taking into consideration in design phase and become part of design section. By doing so, the semiconductor package could be applied in the reflow process for mass production.

In summary, the present invention forms the signal leads and the ground lead directly under the back side of the die, forms the buffer layer between the molding portion and the die to absorb the stress applied to the die, and forms the hot vias and the vias within the die to spare the area of the semiconductor package. Compared to the prior art, the size and the production cost of the semiconductor package of the present invention are reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a plurality of semiconductor packages, wherein the manufacturing method is performed before an assembly process for the plurality of semiconductor packages, the method comprising:
    forming signal leads and ground leads directly under a back side of a wafer, wherein the wafer comprises a plurality of dies, each die comprises at least a via and a least a hot via, and the at least a via and the at least a hot via penetrate through the die;
    forming at least a metal sheet on a top side of the die, wherein the at least a metal sheet is directly connected to the at least a via or the at least a hot via;
    forming a buffer layer on the top of wafer to cover the metal sheet;
    forming a molding portion on the buffer layer, wherein the buffer layer isolates the at least a metal sheet from being contacted by the molding portion, and the molding portion has no contact with the ground lead or the signal lead; and
    dividing the wafer, the buffer layer and the molding portion into the plurality of semiconductor packages.

2. The manufacturing method of claim 1, wherein the wafer is manufactured by a Gallium Arsenide (GaAs) process.

3. A manufacturing method of a plurality of semiconductor packages, wherein the manufacturing method is performed before an assembly process for the plurality of semiconductor packages, the method comprising:
    forming a signal lead and a ground lead directly under a back side of a die, wherein the die comprises at least a via and a least a hot via, and the at least a via and the at least a hot via penetrate through the die;
    forming at least a metal sheet on a top side of the die, wherein the at least a metal sheet is directly connected to the at least a via or the at least a hot via;
    forming a buffer layer on the top side of the die to cover the metal sheet;
    forming a molding portion to cover the buffer layer, wherein the buffer layer is isolates the at least a metal sheet from being contacted by the molding portion, and the molding portion has no contact with the ground lead or the signal lead; and
    performing a singulation process to form a plurality of semiconductor packages.

4. The manufacturing method of claim 3, further comprising:
    attaching a tape on a back side of the die before forming the molding portion on the buffer layer.

5. A semiconductor package, comprising:
    a die, comprising at least a via and at least a hot via, wherein the at least a via and the at least a hot via penetrate through the die;
    at least a metal sheet, disposed on a top side of the die, directly connected to the at least a via or the at least a hot via;
    a ground lead, formed directly under a back side of the die, contacting with the back side of the die, and directly connected to the at least a via of the die;

a signal lead, formed directly under the back side of the die, contacting with the back side of the die, and directly connected to the a least a hot via of the die;

a buffer layer, formed on the top side of the die, configured to cover the least a metal sheet, absorb a stress applied to the die and prevent the die from damage; and a molding portion, formed on a top side of the buffer layer, configured to cover the top side of the buffer layer;

wherein the buffer layer isolates the at least a metal sheet from being contacted by the molding portion;

wherein the molding portion has no contact with the ground lead or the signal lead.

6. The semiconductor package of claim 5, wherein the buffer layer is selected from a group consisting of polyimide (PI), polybenzoxazole (PBO), and benzocyclobuten (BCB) and silicon nitride.

7. The semiconductor package of claim 5, wherein the semiconductor package is manufactured by a wafer level packaging (WLP) technology.

8. The semiconductor package of claim 5, wherein an area of the ground lead is larger than 50% of an area of the back side of the die.

9. The semiconductor package of claim 5, wherein a bottom edge of the molding portion is aligned with a bottom edge of the die.

10. The semiconductor package of claim 5, wherein a side edge of the molding portion is aligned with a side edge of the die.

11. The semiconductor package of claim 5, wherein an area of the ground lead is larger than 100*100 square micrometers ($\mu m^2$).

12. The semiconductor package of claim 5, wherein an area of the ground lead is larger than an area of the signal lead.

13. The semiconductor package of claim 5, wherein the at least a hot via comprise a hollow structure.

14. The semiconductor package of claim 5, wherein a gap is formed between the ground lead and the signal lead.

15. The semiconductor package of claim 14, wherein the gap is larger than 50 micrometers ($\mu m$).

16. The semiconductor package of claim 14, wherein the gap is 300 micrometers ($\mu m$).

* * * * *